(12) United States Patent
Lin et al.

(10) Patent No.: US 8,466,557 B2
(45) Date of Patent: *Jun. 18, 2013

(54) SOLDER BUMP CONFINEMENT SYSTEM FOR AN INTEGRATED CIRCUIT PACKAGE

(75) Inventors: Yaojian Lin, Singapore (SG); Pandi Chelvam Marimuthu, Singapore (SG); Rajendra D. Pendse, Fremont, CA (US)

(73) Assignee: Stats Chippac Ltd., Singapore (SG)

( * ) Notice: Subject to any disclaimer, the term of this patent is extended or adjusted under 35 U.S.C. 154(b) by 545 days.

This patent is subject to a terminal disclaimer.

(21) Appl. No.: 12/756,067

(22) Filed: Apr. 7, 2010

(65) Prior Publication Data

US 2010/0193226 A1 Aug. 5, 2010

Related U.S. Application Data

(62) Division of application No. 11/671,900, filed on Feb. 6, 2007, now Pat. No. 7,723,225.

(60) Provisional application No. 60/766,718, filed on Feb. 7, 2006.

(51) Int. Cl.
*H01L 23/48* (2006.01)

(52) U.S. Cl.
USPC .................... 257/753; 257/E21.169; 438/612

(58) Field of Classification Search
USPC ................ 257/750, 751, 753, 762, 763, 764, 257/766, 767, 768, 769, 770, 771, 772, 774, 257/E21.169; 438/612, 653, 654, 656
See application file for complete search history.

(56) References Cited

U.S. PATENT DOCUMENTS

| | | | |
|---|---|---|---|
| 6,596,619 B1 | 7/2003 | Wang et al. |
| 6,819,002 B2 | 11/2004 | Chen et al. |
| 6,878,633 B2 | 4/2005 | Raskin et al. |
| 7,043,830 B2 | 5/2006 | Farnworth |
| 7,135,355 B2 | 11/2006 | Chan et al. |
| 7,144,759 B1 | 12/2006 | Hilton et al. |
| 7,375,020 B2 | 5/2008 | Wu et al. |
| 2007/0029669 A1 | 2/2007 | Stepniak et al. |

*Primary Examiner* — David Vu
(74) *Attorney, Agent, or Firm* — Ishimaru & Associates LLP

(57) ABSTRACT

A solder bump confinement system is provided includes a substrate; a contact material patterned on the substrate; an inner passivation layer deposited over the contact material and the substrate; an under bump material pad over the contact material; an under bump material defining layer, having a bump opening contained therein, directly on the under bump material pad in which the under bump material defining layer has a thickness in the range of 200 Angstrom to 1500 Angstrom; and a system interconnect formed over the contact material and coupled to the under bump material defining layer and the under bump material pad through the bump opening.

10 Claims, 5 Drawing Sheets

SOLDER BUMP CONFINEMENT SYSTEM FOR AN INTEGRATED CIRCUIT PACKAGE

CROSS-REFERENCE TO RELATED APPLICATION

This application is a divisional of U.S. patent application Ser. No. 11/671,900 filed Feb. 6, 2007, now U.S. Pat. No. 7,723,225, which claims the benefit of U.S. Provisional Patent Application Ser. No. 60/766,718 filed Feb. 7, 2006.

TECHNICAL FIELD

The present invention relates generally to integrated circuit packaging, and more particularly to a system for attachment of thin film products.

BACKGROUND ART

With continuously decreasing semiconductor device dimensions and increasing device-packaging densities, the packaging of semiconductor devices has continued to gain in importance. In the electronics industry, the continuing goal has been to reduce the size of electronic devices such as in digital cameras, camcorders, cellular telephones, personal video players, and personal data appliances. In fact the latest telephones may include a camera capable of video capture and playing videos.

In the past, integrated circuits were packaged in relatively large lead frame packages having wire bonds using metal wires, but the packaging technology has been moving towards ball bond packages using solder balls, which allow for a higher density of connections as well as delivering a smaller package footprint.

Because the marketplace is in the process of transition, it is desirable to mix both wire and ball bonds in the same integrated circuit package. In instances where multiple integrated circuit dice are packaged in a single System-in-Package design, mixing wire bonds and ball bonds is essential.

Unfortunately, the requirements for wire and ball bonds are different. For example, aluminum (Al) is typically used for the wires because it is a very easily bent with little springback. Al wire bonds well to pads of Al. On the other hand, tin (Sn) solder is typically used for the ball bonds because it has a high surface tension for forming small balls. Sn solder bonds well to pads of copper (Cu), which is a very good soldering wettable material.

The above results in the requirement for Al bond pads for wire bonds and Cu bond pads for ball bonds. Unfortunately, Al wire does not bond well with Cu bond pads and Sn solder does not bond well with Al bond pads.

In the past, Al was used in the final metal pads during integrated circuit fabrication, and Cu pads were made by thin-film deposition over the Al pads by an additional step of evaporation or sputtering. The thin-film layers of Cu are referred to as "under bump metallurgy" (UBM). The UBM plays a critical role as an adhesion layer between Al pads and solder bumps. To get different metal pads in one integrated circuit package, various approaches have been attempted, but have had the problems of requiring different masks to protect the Al pad in order to obtain a desired UBM.

Thus, a need still remains for a solder bump confinement system for an integrated circuit package that may be compatible with wire bonding processes. In view of the intense commercial pressure to develop products with multiple diverse functions, it is increasingly critical that answers be found to these problems. In view of the ever-increasing commercial competitive pressures, along with growing consumer expectations and the diminishing opportunities for meaningful product differentiation in the marketplace, it is critical that answers be found for these problems. Additionally, the need to save costs, improve efficiencies and performance, and meet competitive pressures, adds an even greater urgency to the critical necessity for finding answers to these problems.

Solutions to these problems have long been sought but prior developments have not taught or suggested any solutions and, thus, solutions to these problems have long eluded those skilled in the art.

DISCLOSURE OF THE INVENTION

The present invention provides a solder bump confinement method including providing a substrate; patterning a contact material on the substrate; depositing an inner passivation layer over the contact material and the substrate; forming an under bump material defining layer over the contact material by sputtering; and forming a system interconnect over the contact material and on the under bump material defining layer.

The present invention provides a solder bump confinement system including a substrate; a contact material patterned on the substrate; an inner passivation layer deposited over the contact material and the substrate; an under bump material pad over the contact material; an under bump material defining layer, having a bump opening contained therein, directly on the under bump material pad in which the under bump material defining layer has a thickness in the range of 200 Angstrom to 1500 Angstrom; and a system interconnect formed over the contact material and coupled to the under bump material defining layer and the under bump material pad through the bump opening.

Certain embodiments of the invention have other aspects in addition to or in place of those mentioned above. The aspects will become apparent to those skilled in the art from a reading of the following detailed description when taken with reference to the accompanying drawings.

BEST MODE FOR CARRYING OUT THE INVENTION

Figure 1:
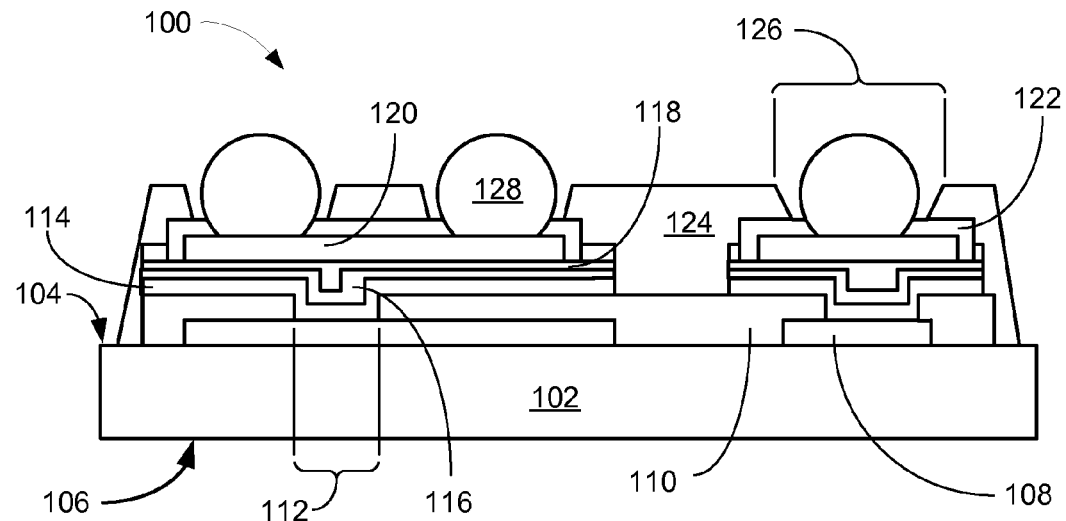
FIG. 1 is a cross-sectional view of a solder bump confinement system, in an embodiment of the present invention.

The following embodiments are described in sufficient detail to enable those skilled in the art to make and use the invention. It is to be understood that other embodiments would be evident based on the present disclosure, and that process or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail. Likewise, the drawings showing embodiments of the system are semi-diagrammatic and not to scale and, particularly, some of the dimensions are for the clarity of presentation and are shown greatly exaggerated in the drawing FIGs. Where multiple embodiments are disclosed and described, having some features in common, for clarity and ease of illustration, description, and comprehension thereof, similar and like features one to another will ordinarily be described with like reference numerals.

For expository purposes, the term "horizontal" as used herein is defined as a plane parallel to the plane or surface of the substrate, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane. The term "on" means there is direct contact among elements. The term "system" means the method and the apparatus of the present invention. The term "processing" as used herein includes stamping, forging, patterning, exposure, development, etching, cleaning, and/or removal of the material or laser trimming as required in forming a described structure.

Referring now to FIG. 1, therein is shown a cross-sectional view of a solder bump confinement system 100, in an embodiment of the present invention. The cross-sectional view of the solder bump confinement system 100 depicts a substrate 102, such as a semiconductor wafer, a MEMS substrate, or a printed circuit board, having an active side 104 and a back side 106. A contact material 108, such as Al/Al alloy, Cu with adhesion/barrier layer, Au/Ni/Cu stack, is formed on the active side 104. An inner passivation layer 110 is formed over the contact material 108 leaving an opening 112 which has an adhesion layer 114, such as titanium (Ti), titanium tungsten (TiW), titanium nitride (TiN), chromium (Cr), aluminum (Al), aluminum alloy, tantalum (Ta), or tantalum nitride (TaN). A barrier layer 116 may be included, such as nickel vanadium (NiV), chromium copper (CrCu), titanium tungsten (TiW), tantalum nitride (TaN), or titanium nitride (TiN). A seed layer 118, such as a copper seed layer, may be deposited over the barrier layer 116 by sputtering.

A pad 120, such as a copper pad, bar, or redistribution layer, may be selectively electroplated on the seed layer 118 with a photo resist lithography process. The electroplating process is optional and could be application dependent. An under bump material (UBM) defining layer 122, such as titanium (Ti), titanium tungsten (TiW), titanium nitride (TiN), chromium (Cr), aluminum (Al), aluminum alloy, tantalum (Ta), or tantalum nitride (TaN), is deposited over the pad 120 by sputtering. The UBM defining layer 122 may be the same material used for the adhesion layer 114, in order to simplify the manufacturing process. Another aspect of the embodiments of the solder bump confinement system 100 is that by utilizing the UBM defining layer 122, as opposed to the previous known method of UBM stack etch-back, a high temperature process becomes unnecessary.

An outer passivation layer 124, such as polyimide, benzocyclobutene (BCB), polybenzoxazole (PBO), or other solder mask film, may be formed for applications that do not require an under-fill or molding process in the next level of assembly. The outer passivation layer 124 may be cured in an oven at a specific temperature, such as 375 degrees Celsius. An interconnect aperture 126 is formed in the outer passivation layer 124 in order to provide access so that a system interconnect 128, such as a solder ball, solder bump, solder column, or stud bump, may be formed on the UBM defining layer 122.

Figure 2:
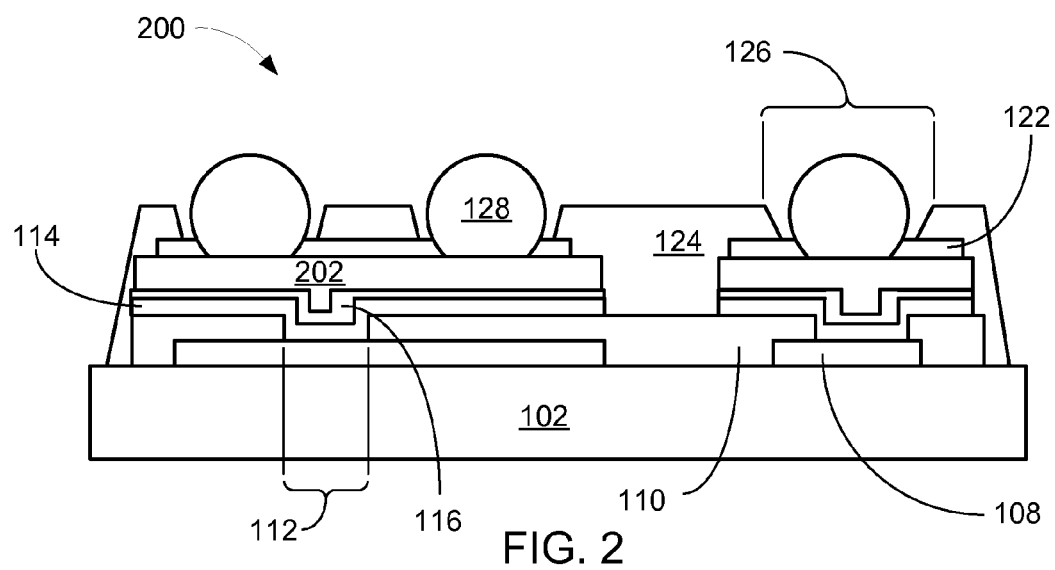
FIG. 2 is a cross-sectional view of a solder bump confinement system, in an alternative embodiment of the present invention.

Referring now to FIG. 2, therein is shown a cross-sectional view of a solder bump confinement system 200, in an alternative embodiment of the present invention. The cross-sectional view of the solder bump confinement system 200 depicts the substrate 102, such as a semiconductor wafer, a MEMS substrate, or a printed circuit board, having the contact material 108 formed over the substrate 102. The inner passivation layer 110 is deposited on the substrate 102 and the contact material 108. The opening 112 in the inner passivation layer 110 allows the adhesion layer 114 to connect to the contact material 108. The adhesion layer 114 is formed of a material that is compatible with the contact material 108 in order to establish a solid connection between them.

The barrier layer 116 is a transition material that may prevent an adverse reaction between the adhesion layer 114 and an under bump material (UBM) pad 202, such as a copper, aluminum, or gold pad. The UBM defining layer 122 is formed directly on the UBM pad 202. The outer passivation layer 124 has the interconnect aperture 126 that may provide a clearance for the system interconnect 128, which may be coupled to the UBM defining layer 122 and the UBM pad 202, through a bump opening within the surface of the UBM defining layer 122.

Figure 3:
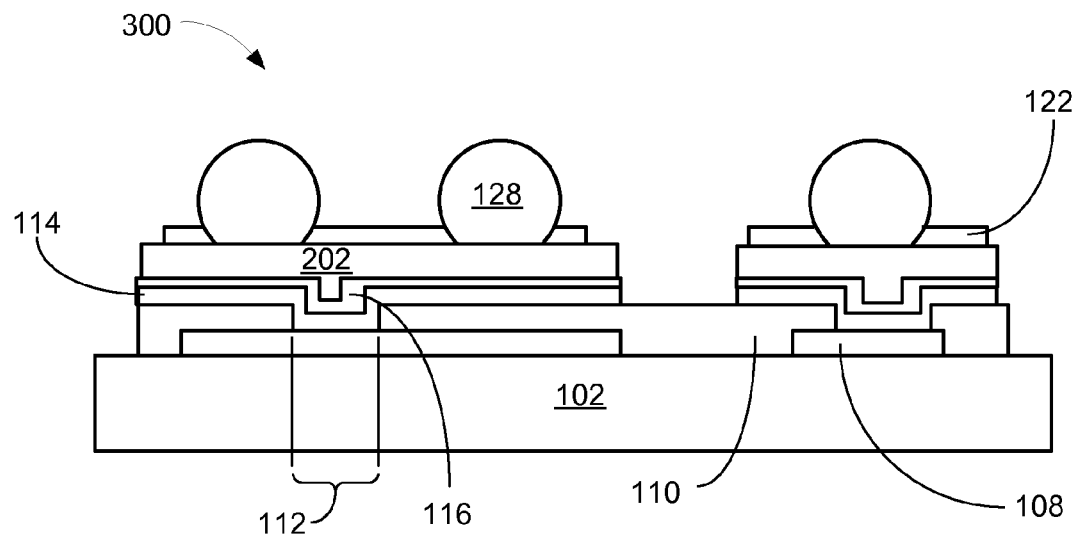
FIG. 3 is a cross-sectional view of a solder bump confinement system, in another alternative embodiment of the present invention.

Referring now to FIG. 3, therein is shown a cross-sectional view of a solder bump confinement system, in another alternative embodiment of the present invention. The cross-sectional view of the solder bump confinement system 300 depicts the substrate 102, such as a semiconductor wafer, a MEMS substrate, or a printed circuit board, having the contact material 108 formed over the substrate 102. The inner passivation layer 110 is deposited on the substrate 102 and the contact material 108. The opening 112 in the inner passivation layer 110 allows the adhesion layer 114 to connect to the contact material 108. The adhesion layer 114 is formed of a material that is compatible with the contact material 108 in order to establish a solid connection between them.

The barrier layer 116 is a transition material that may prevent an adverse reaction between the adhesion layer 114 and the UBM pad 202, such as a copper pad. The UBM defining layer 122 is formed on the UBM pad 202. The System interconnects 128 are formed of a eutectic solder, made of alloys such as bismuth/tin (BiSn), tin/silver (SnAg), tin/silver/copper (SnAgCu), tin/copper (SnCu), or tin/zinc (SnZn).

In this embodiment of the present invention, there is no need for the outer passivation layer 124 of FIG. 1. In the next level of assembly, either an underfill material or a molding compound may take the place of the outer passivation layer 124, of FIG. 1. By customizing the assembly configuration material cost and processing time may be saved with no yield impact.

Figure 4:
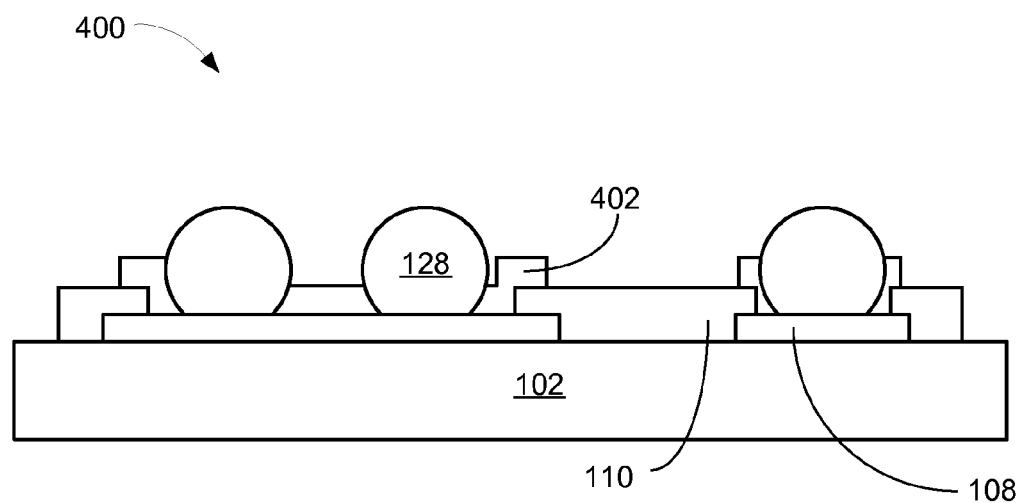
FIG. 4 is a cross-sectional view of a solder bump confinement system, in yet another alternative embodiment of the present invention.

Referring now to FIG. 4 therein is shown a cross-sectional view of a solder bump confinement system 400, in yet another alternative embodiment of the present invention. The cross-sectional view of the solder bump confinement system 400 depicts the substrate 102, such as a semiconductor wafer, a MEMS substrate, or a printed circuit board, having the contact material 108 formed over the substrate 102. The contact material 108 may be aluminum, aluminum alloy, copper with an adhesion and barrier layer, stack of gold/nickel/copper, stack of gold/nickel/aluminum alloy, or other UBM stack. The inner passivation layer 110 may be silicon nitride ($Si_xN_y$), a stack of silicon nitride/silicon dioxide ($Si_xN_y/SiO_2$), silicon oxynitride (SiON), Low-K dielectric material, benzocyclobutene (BCB), polybenzoxazole (PBO), or other solder mask film. A UBM defining layer 402 may be formed over the contact material 108 and the inner passivation layer 110. The UBM defining layer 402 may be formed of materials such as titanium (Ti), titanium tungsten (TiW), titanium nitride (TiN), chromium (Cr), aluminum (Al), aluminum alloy, tantalum (Ta), or tantalum nitride (TaN).

Figure 5:
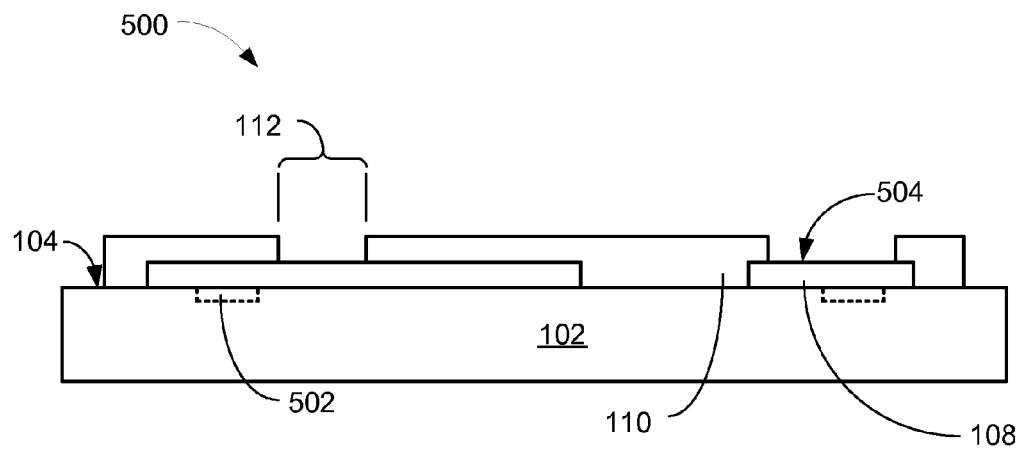
FIG. 5 is a cross-sectional view of a substrate assembly in a passivation opening phase of manufacturing.

Referring now to FIG. 5, therein is shown a cross-sectional view of a substrate assembly 500 in a passivation opening phase of manufacturing. The cross-sectional view of the substrate assembly 500 depicts the substrate 102 having the contact material 108 formed on the active side 104. The geometry of the contact material 108 may be the result of a photoresist process and a deposition process, such as sputtering, physical vapor deposition (PVD), or the like. The position of the contact material 108 is determined by the availability of an electrical interface 502 on the active side 104. The electrical interface is a portion of the circuit or function (not shown) on the active side 104 of the substrate 102. The contact material 108 may for the base of a re-distribution layer, bump interface, or connect an integrated passive device (not shown).

The inner passivation layer 110 may be patterned by a photoresist process to establish the opening 112. The inner passivation layer 110 insulates and isolates the active side 104 of the substrate 102 providing a level of protection for the embedded functions and the contact material 108 for further manufacturing steps. The opening 112 in the inner passivation layer 110 provides access to a connection surface 504 on the contact material 108. The inner passivation layer 110 may be formed by a deposition process, such as a spin-on deposition, CVD, or the like.

Figure 6:
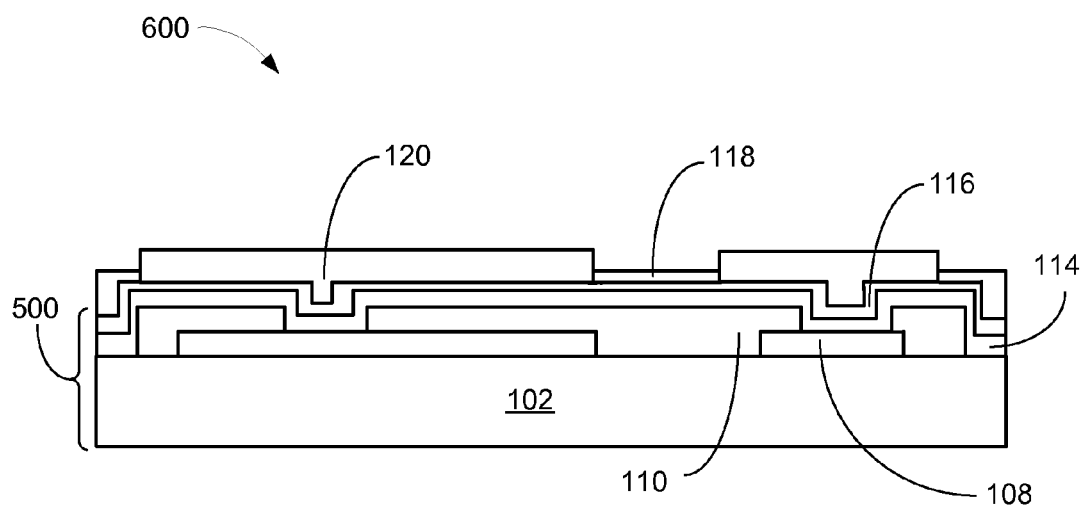
FIG. 6 is a cross-sectional view of the substrate assembly, of FIG. 5, in a pad deposition phase of manufacturing.

Referring now to FIG. 6, therein is shown a cross-sectional view of the substrate assembly 500, of FIG. 5, in a pad deposition phase of manufacturing. The cross-sectional view of the substrate assembly 500 depicts the adhesion layer 114 deposited over the surface of the substrate assembly 500. The adhesion layer 114 is of a material that is compatible with the contact material 108. The adhesion layer 114 may be composed of titanium (Ti), titanium tungsten (TiW), titanium nitride (TiN), chromium (Cr), aluminum (Al), aluminum alloy, tantalum (Ta), or tantalum nitride (TaN). The adhesion layer 114 may be in the range of 200 Å to 1500 Å thick with a target thickness of 500 Å. A sputtering process, CVD process, or plasma vapor deposition (PVD) process may be used to form the adhesion layer. An electrical connection is formed at the connection surface 504 between the contact material 108 and the adhesion layer 114. While the adhesion layer 114 is on the inner passivation layer 110 as well, no electrical connection is made due to the insulating properties of the inner passivation layer 110.

The barrier layer 116 is formed on the adhesion layer 114. The barrier layer 116 acts as a reaction blocker between two dissimilar materials. The barrier layer may be composed of nickel vanadium (NiV), chromium copper (CrCu), titanium tungsten (TiW), tantalum nitride (TaN), or titanium nitride (TiN). The barrier layer 116 may be deposited by a sputtering process, CVD process, a PVD process, or the like. The barrier layer thickness may be 800 Å to 3000 Å, with a target thickness of 1000 Å.

The seed layer 118 is formed on the barrier layer 116. The seed layer 118 may be deposited by a sputtering process and completely coats the surface of the barrier layer 116. The seed layer 118 may have a thickness in the range 1000 Å to 8000 Å, with a target thickness of 2000 Å. The purpose of the seed layer 118 is to establish a foundation for the pad 120.

The pad 120 is of the substantially similar material as the seed layer 118, but the mode and volume of deposition is very different. The photoresist process may be used to pattern the area for deposition of the pad 120. The pad 120 may be deposited through an electro-plating process. The pad 120 may have a thickness in the range of 2 μm to 100 μm with a target of 8 μm. This is significantly thicker than the seed layer 118, which allows the rapid deposition of the pad 120. The geometry of the pad 120 may also provide a redistribution layer for routing the electrical signals from the substrate 102.

It has been discovered that physical vapor deposition (PVD) or sputtering may be used to achieve a low temperature process, such as less than 200° C., for application of the critical dimensions. Since all of the layers in the solder bump confinement system 100 may be applied by the sputtering process, precious time can be saved in the manufacturing flow. The criticality of the thickness ranges and the target thickness of each layer supports the reliability requirements of the manufactured device, while being within the statistical control limits of the sputtering process.

Figure 7:
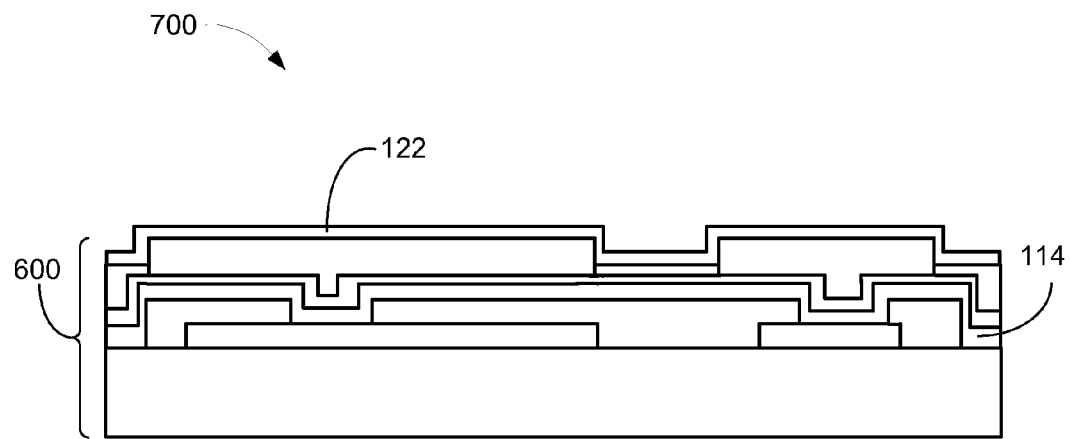
FIG. 7 is a cross-sectional view of the substrate assembly, of FIG. 6, in a UBM defining layer deposition phase of manufacturing.

Referring now to FIG. 7, therein is shown a cross-sectional view of a substrate assembly 600, of FIG. 6, in a UBM defining layer deposition phase of manufacturing. The cross-sectional view of the substrate assembly 600 depicts the UBM defining layer 122 on the substrate assembly 600. The UBM defining layer 122 may be deposited by the sputtering process, CVD process, or PVD process. The material used for the UBM defining layer 122 may be substantially similar to the material used for the adhesion layer 114, such as titanium (Ti), titanium tungsten (TiW), titanium nitride (TiN), chromium (Cr), aluminum (Al), aluminum alloy, tantalum (Ta), or tantalum nitride (TaN).

Figure 8:
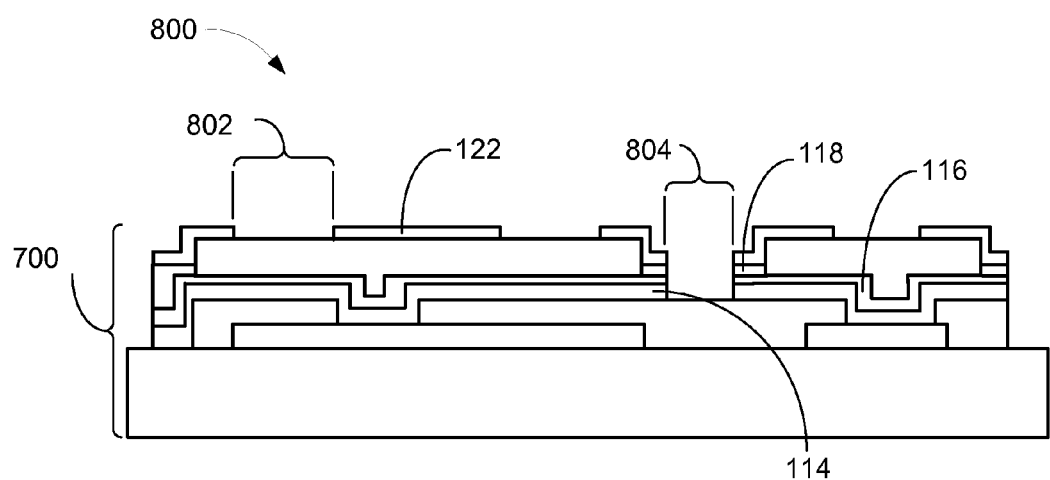
FIG. 8 is a cross-sectional view of the substrate assembly, of FIG. 7, in an etching phase of manufacturing.

Referring now to FIG. 8, therein is shown a cross-sectional view of a substrate assembly 700, of FIG. 7, in an etching phase of manufacturing. The cross-sectional view of the substrate assembly 700 depicts a bump opening 802 in the UBM defining layer 122 and an isolation region 804. The bump opening 802 and the isolation region 804 are patterned using a photoresist process. An etching process is used to remove the UBM defining layer 122 from the bump opening 802 and the isolation region 804. An additional photoresist process may be used to protect the bump opening 802 while an additional etching process removes the seed layer 118, the barrier layer 116, and the adhesion layer 114. The secondary etching process segregates some of the bump openings 802 that had been electrically connected by the application of each of the conductive layers, such as the adhesion layer 114, the barrier layer 116, and the seed layer 118.

Figure 9:
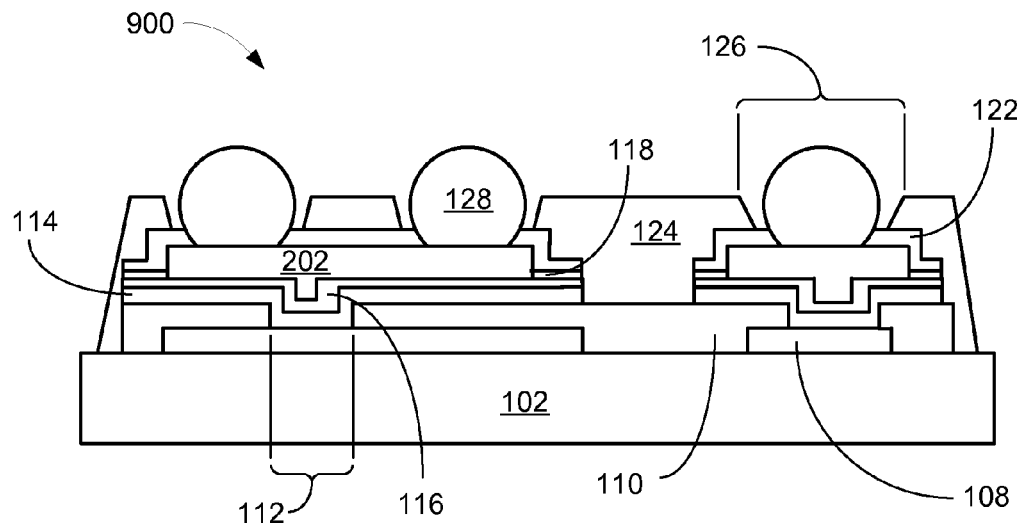
FIG. 9 is a cross-sectional view of the substrate assembly, of FIG. 8, in a bump attach phase of manufacturing.

Referring now to FIG. 9, therein is shown a cross-sectional view of a substrate assembly 800, of FIG. 8, in a bump attach phase of manufacturing. The cross-sectional view of the substrate assembly 800 depicts the substrate 102 having the contact material 108 attached thereon. The inner passivation layer 110 is patterned to cover the substrate 102 and the contact material 108 while leaving the opening 112 for further electrical connection to the conductive layers, such as the adhesion layer 114, the barrier layer 116, and the seed layer 118. The UBM pad 202, such as a copper pad, a gold pad, or an aluminum pad, may be electro plated in a patterned region over the seed layer 118. The UBM defining layer 122 may be formed over the UBM pad 202 and the seed layer 118. In successive etching processes the UBM defining layer 122 is opened and the UBM pad 202 is segregated by etching through the conductive layers, such as the adhesion layer 114, the barrier layer 116, and the seed layer 118.

The outer passivation layer 124 may be patterned over the substrate 102 and the UBM defining layer 122. The outer passivation layer 124, such as polyimide, benzocyclobutene (BCB), polybenzoxazole (PBO), or other solder mask film, may be formed for applications that do not require an underfill or molding process in the next level of assembly. The interconnect aperture 126 is left open for the later attachment of the system interconnects 128. The system interconnects 128, such as solder bumps, stud bumps, or solder columns, allow the attachment to the next level system.

Figure 10:
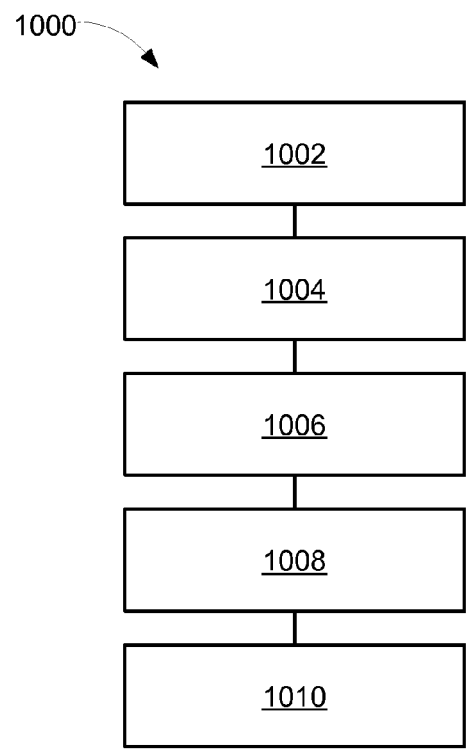
FIG. 10 is a flow chart of a solder bump confinement system for manufacturing the solder bump confinement system, in an embodiment of the present invention.

Referring now to FIG. 10, therein is shown a flow chart of a solder bump confinement system 1000 for the manufacture of the solder bump confinement system 100 in an embodiment of the present invention. The system 1000 includes providing a substrate in a block 1002; patterning a contact material on the substrate in a block 1004; depositing an inner passivation layer over the contact material and the substrate in a block 1006; forming an under bump material defining layer over the contact material by sputtering in a block 1008; and forming a system interconnect over the contact material and on the under bump material defining layer in a block 1010.

It has been discovered that the embodiments of the present invention thus have numerous aspects.

A principle aspect of the embodiments of the present invention is that the structure of the solder bump confinement system provides a fast and inexpensive structure due to the lack of high temperature processes in the construction.

Yet another important aspect of the present invention is that it valuably supports and services the historical trend of reducing costs, simplifying systems, and increasing performance.

These and other valuable aspects of the present invention consequently further the state of the technology to at least the next level.

Thus, it has been discovered that the solder bump confinement system of the present invention furnishes important and heretofore unknown and unavailable solutions, capabilities, and functional aspects for system attach structures for semiconductor wafers, MEMS wafers, or printed circuit boards. The resulting processes and configurations are straightforward, cost-effective, uncomplicated, highly versatile and effective, can be surprisingly and unobviously implemented by adapting known technologies, and are thus readily suited for efficiently and economically manufacturing integrated circuits, MEMS devices, or printed circuit boards fully compatible with conventional manufacturing processes and technologies. The resulting processes and configurations are straightforward, cost-effective, uncomplicated, highly versatile, accurate, sensitive, and effective, and can be implemented by adapting known components for ready, efficient, and economical manufacturing, application, and utilization.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A solder bump confinement system comprising:
   a substrate;
   a contact material patterned on the substrate;
   an inner passivation layer deposited over the contact material and the substrate;
   an under bump material pad over the contact material;
   an under bump material defining layer, having a bump opening contained therein, directly on the under bump material pad in which the under bump material defining layer has a thickness in the range of 200 Angstrom to 1500 Angstrom; and
   a system interconnect formed over the contact material and coupled to the under bump material defining layer and the under bump material pad through the bump opening.

2. The system as claimed in claim 1 further comprising an adhesion layer on the contact material and the inner passivation layer in which the adhesion layer has the thickness in the range of 200 Angstrom to 1500 Angstrom.

3. The system as claimed in claim 1 in further comprising a seed layer between the contact material and the under bump material defining layer in which the seed layer has the thickness in the range of 1000 Angstrom to 8000 Angstrom.

4. The system as claimed in claim 1 further comprising a barrier layer between the contact material and the under bump material defining layer in which the barrier layer has the thickness in the range of 800 Angstrom to 3000 Angstrom.

5. The system as claimed in claim 1 further comprising an outer passivation layer on the under bump material defining layer and the inner passivation layer.

6. The system as claimed in claim 1 wherein the substrate includes a semiconductor wafer, a MEMS wafer, or a printed circuit board.

7. The system as claimed in claim 6 further comprising an adhesion layer on the contact material and the inner passivation layer in which the adhesion layer has the thickness in the range of 200 Angstrom to 1500 Angstrom includes the adhesion layer of titanium, titanium tungsten, chromium, aluminum, aluminum alloy, tantalum, or tantalum nitride.

8. The system as claimed in claim 6 in further comprising a seed layer between the contact material and the under bump material defining layer in which the seed layer has the thickness in the range of 1000 Angstrom to 8000 Angstrom includes the seed layer of copper, aluminum, or gold.

9. The system as claimed in claim 6 further comprising a barrier layer between the contact material and the under bump material defining layer in which the barrier layer has the thickness in the range of 800 Angstrom to 3000 Angstrom includes the barrier layer of nickel vanadium, chromium copper, titanium tungsten, titanium nitride, or tantalum nitride.

10. The system as claimed in claim 6 further comprising an outer passivation layer on the under bump material defining layer and the inner passivation layer in which the outer passivation layer includes polyimide, benzocyclobutene, polybenzoxazole, or solder mask film.

* * * * *